United States Patent [19]

Huddleston

[11] Patent Number: 5,067,695

[45] Date of Patent: Nov. 26, 1991

[54] CIRCUIT BOARD SUPPORT APPARATUS FOR USE WITH CIRCUIT BOARD LEAD TRIMMER

[75] Inventor: Brent D. Huddleston, Kuna, Id.

[73] Assignee: Micron Technology, Inc., Boise, Id.

[21] Appl. No.: 349,046

[22] Filed: May 8, 1989

[51] Int. Cl.[5] .............................................. B25B 11/00
[52] U.S. Cl. ......................................... 269/21; 269/8; 269/296; 269/903
[58] Field of Search ................. 269/8, 21, 265, 289 R, 269/296, 297, 303, 304, 305, 900, 903

[56] References Cited

U.S. PATENT DOCUMENTS

| | | | |
|---|---|---|---|
| 2,487,944 | 11/1949 | Pressman | 269/8 |
| 3,976,288 | 8/1976 | Cuomo, Jr. | 269/21 |
| 4,399,988 | 8/1983 | DeShong | 269/8 |
| 4,839,117 | 6/1989 | Swenson et al. | 269/21 |
| 4,960,019 | 10/1990 | Levene et al. | 269/21 |
| 5,005,814 | 4/1991 | Gumbert | 269/903 |

Primary Examiner—J. J. Hartman
Attorney, Agent, or Firm—Angus C. Fox, III

[57] ABSTRACT

A support apparatus for a through-hole soldered circuit board for use with circuit board lead trimmer of the type having a planarly-movable cutting head and a base plate below the cutting head parallel to the head's plane of movement, the setup of which can be changed rapidly and with little probability of error by a low-skilled operator. The apparatus comprises a perimeter frame of uniform height, affixed rigidly and hermetically in a planar configuration by its base to the ferromagnetic base plate of the lead trimming machine; a plurality of equal-height support posts or rods, each having a board-support apex and a magnetic base perpendicular to its associated post; a support post positioning plate, the lower surface of which is drilled with a series of holes, the centers of which correspond to planar, unpopulated regions, free of conductive traces, on the populated side of a circuit board to be trimmed; and a circuit board support plate having a cut-out which is smaller, but proportionally similar to the profile of the board to be lead trimmed. The support posts are inserted into the holes in the positioning plate from its lower surface, each support post being retained in its respective positioning plate hole by its magnetized base.

12 Claims, 1 Drawing Sheet

5,067,695

CIRCUIT BOARD SUPPORT APPARATUS FOR USE WITH CIRCUIT BOARD LEAD TRIMMER

FIELD OF THE INVENTION

This invention relates to integrated circuit technology. More specifically, it relates to circuit board support devices for use with circuit board lead trimmers.

BACKGROUND OF THE INVENTION

Integrated semiconductor devices are typically constructed in masse on a wafer of silicon or gallium arsenide. Each device generally takes the form of an integrated circuit (IC) die, which is bonded to the die-mounting paddle of a leadframe. The wire attachment pads on the die are connected with their corresponding leads on the leadframe with aluminum or gold wire during a wire bonding process. The die and leadframe are then encapsulated in a plastic or ceramic package, which is then recognizable as an IC "chip". IC chips come in a variety of forms such as dynamic random access memory (DRAM) chips, static random access memory (SRAM) chips, read only memory (ROM) chips, gate arrays, and so forth. The leads of each chip are connected to conductive traces by any number of techniques such as welding (for high-temperature applications), socketing or soldering. The conductive traces, which are formed by photolithography and etching processes, interconnect the chips and other discrete components such as resistors and capacitors. The traces are relatively delicate and can be easily damaged by improper handling of the boards.

The most commonly-used technique for soldering components and sockets to a printed circuit board is the soldered through-hole technique. With this technique, components are mounted on the top surface of a circuit board, with the leads of the components extending through metal-plated, trace-connected through-holes in the board which are of slightly larger diameter than the leads. The board is then subjected to a wave-soldering process. During the wave soldering process, solder is drawn by capillary action into the clearances between the leads and the through-hole walls. When the solder is allowed to solidify, the leads are securely soldered within the through-holes.

Following the soldering of the component leads within the through-holes, the lead extensions beneath the circuit board must be trimmed to a uniform, optimum length. This is typically done on a lead-trimming machine which operates much like a milling machine. However, since the lead trimmer's cutting head operates in a plane, uniformity of lead length is highly dependent on maintaining the circuit board in a plane that is parallel to that in which the cutting head operates as the leads are trimmed. Failure to maintain the parallel planarity will, at best, result in trimmed leads of varying thickness and, at worst, destruction of the circuit board by running the cutter head into the fiberglass material from which the board is constructed and destroying one or more of the conductive traces that interconnect the board's components.

Typically, circuit boards have been supported during the lead trimming process by support posts having a flat base with can be adhesively attached to the flat bed of the lead trimming machine so that they contact the surface on the component side of the circuit board at points where there are no components, no traces to damage, and no elevated solder regions that would cause the circuit board to warp slightly as it is supported. Each of the support posts must be individually located on the bed of the trimming machine by precise measurement of the circuit board. The edges of the circuit board are then supported by an adjustable frame having the same height as each of the support posts. When significant gaps have been sealed, a vacuum is applied to the lower surface of the board and it is held firmly in place against the support posts and adjustable frame. This support technique has at least four significant drawbacks. The first is the inordinate amount of time required for setup each time the leads of a different board must be trimmed; the second is the inconvenience of having to use an adhesive material to anchor the support posts to the lead trimming machine bed; the third is the high probability or erring when making measurements for support post placement, accompanied by a high probability of board damage before the error is discovered; and the fourth is the inherent instability of the support mechanism during the trimming operation.

What is needed is a more stable printed circuit board support apparatus that can be easily and rapidly adapted for a variety of different circuit boards, with much greater accuracy and, hence, a greatly minimized chance for the destruction of circuit boards.

SUMMARY OF THE INVENTION

This invention provides a sturdy support apparatus for a through-hole soldered circuit board having an unpopulated perimeter, the setup of which can be changed rapidly and with little probability of error by a semi-skilled operator. The support apparatus is designed for use in conjunction with a circuit board lead trimming machine of the type having a planarly-movable cutting head and a bed or base plate below the cutting head parallel to its plane of movement. The basic apparatus comprises a perimeter frame of uniform height, affixed rigidly and hermetically in a planar configuration by its base to the base plate of the lead trimming machine. If the base plate of the machine is not constructed from a ferromagnetic material, it is overlaid with a thin steel plate. The apparatus also comprises a quantity of equal-height support posts or rods, each having a board-support apex and a magnetic base perpendicular to its associated post. The apparatus further comprises a support post positioning plate, the lower surface of which is drilled with a series of holes or apertures, the centers of which correspond to safe, planar positions on the populated side of a circuit board to be trimmed. The term "safe, planar position" refers to a space on the board between components where there are no conductive traces to be damaged, and where there are no surface irregularities such as a raised solderfilled through-hole connection point. The apertures are sized so that the support rods can be slidably inserted through them, with optimum clearance considered to be approximately 0.05 millimeter. The larger the "safe, planar positions" on the board to be lead trimmed, the less critical is the clearance. The ideal spacing of the apertures forms a matrix which corresponds to apices of identical equilateral triangles having sides approximately equal to 7.5 centimeters. Of course, such spacing is only the ideal and will be dependent on the safe positions available on a particular board. The support posts are inserted through the apertures on the lower surface of the positioning plate. Each support post is retained in its respective positioning plate aperture by its magnetized base. The positioning plate with its inserted support posts is accurately positionable within the perimeter frame such that each support post inserted in an aperture is accurately and vertically positioned with its associated base magnetically attached to the base plate of the machine. The positioning plate may be removed or left in place. If it is lockable in place (for example if the positioning plate fits securely with minimal clearance within the perimeter frame), it is not essential that the bases of the support posts be magnetized (although it is still more convenient, since the support posts are retained in the positioning plate while it is lowered into the perimeter frame). If the perimeter frame and the positioning plate are both of rectangular shape, for example, accurate positioning of the positioning plate within the frame can be effected by fitting an identifiable corner of the positioning plate into a particular corner of the frame. The apparatus additionally comprises a circuit board support plate having a cut-out which is smaller, but proportionally similar to the profile of the particular circuit board. The support plate is accurately and hermetically affixable to the top of said perimeter frame such that the upper surface of the support plate is essentially equiplanar with the plane which passes through the apices of the support posts following the positioning of the support posts on the machine base plate utilizing the positioning plate. The support plate is equipped with a raised border on its upper surface, the interior edge of which has a profile which is essentially identical to that of the edge of the circuit board, with clearance sufficient to allow the circuit board to be inserted without force, populated side down, into the region created by said border, such that the board contacts the upper surface of said support plate. When so positioned within the raised border on the support plate, the safe, planar regions of the circuit board are directly above the apices of the support posts. Since the machine base plate, the perimeter frame, the circuit board and the circuit board support plate form essentially a hermetically-sealed chamber, vacuum may be applied to the chamber in order to securely anchor the circuit board to the support plate and the support posts, the apices of which will contact the safe, planar regions of the circuit board. With vacuum applied, the lead trimming operation may proceed.

PREFERRED EMBODIMENT OF THE INVENTION

Figure 1:
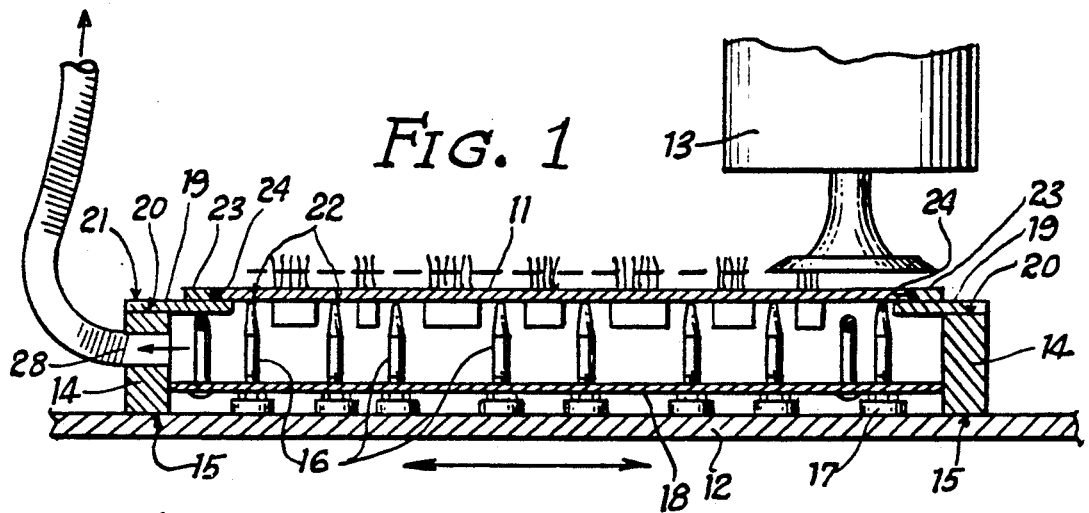
FIG. 1 is a simplified cross-sectional view of a lead trimming machine with the complete board support apparatus installed thereon and a representative circuit board positioned for a lead trimming operation.

Referring now to FIG. 1, a through-hole soldered circuit board 11 is shown positioned on a circuit board support apparatus that constitutes the present invention.

The circuit board support apparatus, in turn, is shown mounted on the base plate 12 of a circuit board lead trimming machine of the type having a cutting head 13 which is planarly movable with respect to base plate 12. The board support apparatus comprises a perimeter frame 14 of uniform height, affixed rigidly and hermetically in a planar configuration by its lower surface 15 to base plate 12; a plurality of equal-height support posts 16, each having a magnetic base 17 perpendicular thereto; a support post positioning plate 18; and a circuit board support plate 19 having a cut-out which is smaller, but proportionally similar to the profile of the circuit board 11 to be lead trimmed. Circuit board support plate 19 is accurately and hermetically affixable to the top surface 20 of perimeter frame 14, such that the upper surface 21 of support plate 19 is essentially equiplanar with the board-support plane which passes through the apices 22 of support posts 16 following the positioning of the support posts on base plate 12 utilizing positioning plate 18. The upper surface 21 of circuit board support plate 19 is equipped with a raised border 23, whose inner edge 24 has a profile which is essentially identical to that of the outer perimeter of the circuit board 11, with clearance just sufficient to allow the circuit board to be inserted without force, populated side down, within the region created by raised border 23, such that a parametric strip of circuit board 11 contacts the upper surface 21 of support plate 19. When so positioned within raised border 23, safe, planar regions of the circuit board are directly above the apices 22 of support posts 16. Once again, the term "safe, planar position" refers to a space on the board between components where there are no conductive traces to be damaged, and where there are no surface irregularities such as a raised solderfilled through-hole connection point.

Figure 2:
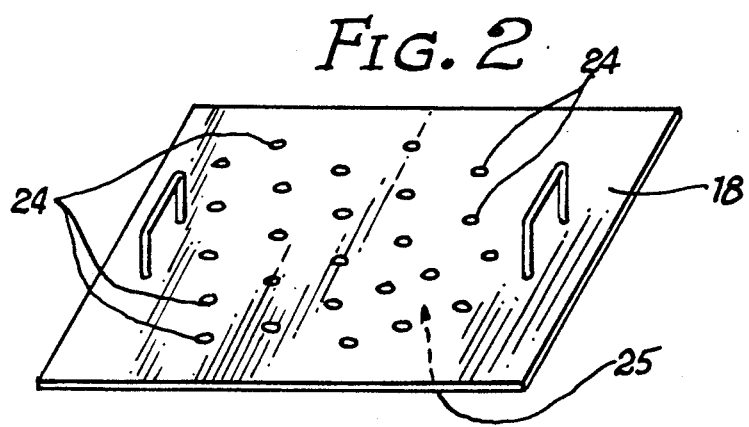
FIG. 2 is an isometric view of the upper surface of the support post positioning plate with no support posts installed therein.

Referring now to FIG. 2, support post positioning plate 18 has been drilled with a series of apertures 24, the centers of which correspond, when view the positioning plate from the lower surface 25, to safe, planar regions on circuit board 11. The holes 24 are sized so that the support posts 16 can be slidably inserted through them, with optimum clearance considered to be approximately 0.05 millimeter. The larger the safe, planar positions on circuit board 11, the less critical the clearance. The ideal spacing of the holes 24 forms a matrix which corresponds to apices of identical equilateral triangles having sides approximately equal to 7.5 centimeters. Of course, such spacing is only the ideal and will be dependent on the safe positions available on a particular board.

Figure 3:
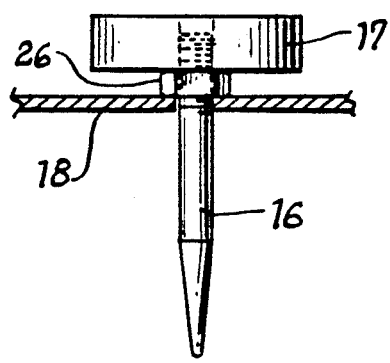
FIG. 3 is a side elevational view of a support post and associated magnetic base installed in an aperture in the support post positioning plate.

Referring now to FIG. 3, a support posts 16 is shown inserted from the lower surface 25 of the positioning plate 18. Each support post 16 is retained in its respective positioning plate hole or aperture by the top of its magnetic base 17, even when positioning plate 18 is turned right side up. Because the magnetism is transmitted through lock nut 26, the magnetic attraction between magnetic base 17 and positioning plate 18 is relatively weak, thus allowing the lower surface of magnetic base 18 to magnetically attach with much greater attraction to ferromagnetic surface, such as the base plate 12 of the lead trimming machine. Incidentally, each support post 16 is threadably attached to its magnetic base 17. Lock nut 26, allows the height of support post 16 to be locked at any point within the adjustable height range. Positioning plate 18, together with the inserted support posts 16, is accurately positionable within the perimeter frame such that each support post 16 is accurately and vertically positionable with its associated base 17 magnetically attached to the base plate 12 of the lead trimming machine. Accurate positioning of positioning plate 18 (and, hence, support posts 16) within perimeter frame 14 can be effected by fitting an identifiable corner of positioning plate 18 into a particular corner of the frame 14.

Figure 4:
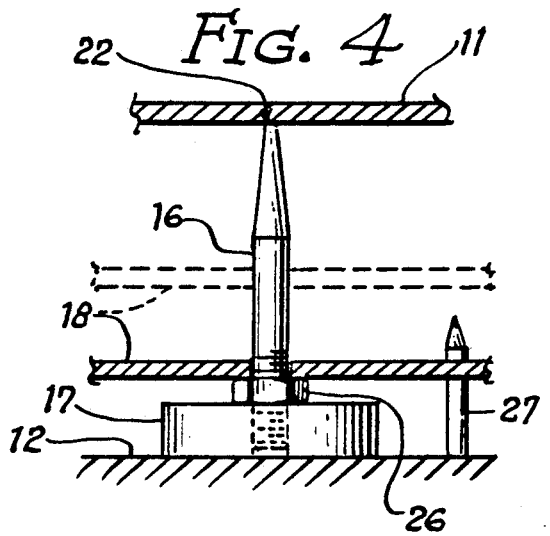
FIG. 4 is a side elevational view of a support post and associated magnetic base, with the base magnetically attached to the ferromagnetic base plate of the lead trimming machine and a circuit board resting on the apex of the support post.

Referring now to FIG. 4, a support post 16 is shown installed right side up in an aperture 24 in positioning plate 18. The magnetic base 17 of support post 16 is magnetically attached to the base 12 plate of the lead trimming machine, and circuit board 11 is resting on the apex of support post 16. Multiple locator pins, such as the single locator pin 27 shown can be used to accurately position positioning plate 18 within perimeter frame 14. Locator pin 27 is permanently installed in base plate 12. Holes in positioning plate 18 slidably mesh with locator pin 27 with minimal clearance. Optimum clearance is considered to be 0.05 mm. A single locator pin can be used to accurately position positioning plate 18 within perimeter frame 14 if a corner of positioning plate 18 is locked within an interior corner of a rectangular perimeter frame 14.

Referring once again to FIG. 1, since the base plate 12 of the lead trimming machine, perimeter frame 14, circuit board 11, and circuit board support plate 19 form what is essentially a hermetically sealed chamber, vacuum may be applied to the chamber through vacuum port 28 in order to securely anchor circuit board 11 to the support plate 19 and cause the safe regions of the circuit board to press against the apices 22 of support posts 16. With vacuum so applied, the lead trimming operation may proceed.

Although only the preferred embodiment of the invention has been described herein, it will be apparent to one skilled in the art that changes and modifications may be made thereto without departing from the spirit and the scope of the invention as claimed. For example, if the base plate 12 of the lead trimming machine is manufactured from a ferromagnetic material, positioning plate 18 may be removed from within perimeter frame 14 once it has been properly positioned therein, with the magnetic bases 17 of support posts 16 magnetically adhering to base plate 12. If base plate 12 is manufactured from a non-ferromagnetic material, it will be necessary to either convert base plate 12 to a ferromagnetic material by overlaying it with a ferromagnetic plate, leave positioning plate 18 (along with the inserted positioning posts) locked in the proper position within perimeter frame 14, or utilize adhesive to secure the base 17 of each support post 16 to base plate 12. The positioning plate 18 can be locked into place by endowing it with the same shape as that of the interior of the perimeter frame (with minimal clearance) or by utilizing an alignment pin or other equivalent technique. Raised border 23, used to accurately position circuit board 11 on circuit board support plate 19 could be replaced by locator pins like the one shown in FIG. 4. The locator pins could slidably mesh with alignment holes in circuit board 11. Raised border 23 can also be discontinuous around the cutout in circuit board support plate 19.

I claim:

1. A support apparatus for a through-hole soldered circuit board having an unpopulated perimeter during the lead-trimming process, said apparatus designed for use in conjunction with a circuit board lead trimming machine of the type having a planarly-movable cutting head and a base plate below the cutting head parallel to its plane of movement, comprising:

(a) a perimeter frame of uniform height, the lower surface of which is rigidly and hermetically affixed to the base plate of the lead trimming machine;

(b) a plurality of removable equal-height support posts, each having a board-support apex and a base perpendicular to its associated post;

(c) a support post positioning plate having upper and lower surfaces and a plurality of support post-positioning apertures, the center of each aperture, when viewed from the positioning plate's lower surface, corresponding dimensionally to a safe, planar position on the populated side of a circuit board to be lead trimmed, into each of which apertures, one of said support posts can be slidably inserted from the positioning plate's lower surface with minimal play, said positioning plate accurately positionable within said frame such that each support post inserted in its respective aperture is accurately and
   vertically positioned with its associated base in contact with the base plate of the lead trimming machine;

(d) means associated with the lead trimming machine baseplate for securely maintaining in position each accurately positioned support post;

(e) a circuit board support plate having a cutout which is smaller, but proportionally similar to the profile of the circuit board to be lead trimmed, said support plate being accurately and hermetically affixed to the top of said perimeter frame such that the upper surface of said support plate is essentially equiplanar with a plane which passes through the apices of said support posts following the positioning said support posts on said base plate utilizing said positioning plate, and said support plate also having circuit board positioning means so that when the circuit board to be lead trimmed is resting on inner edges of the cut-out, the circuit board is positioned such that the apices of said support posts contact the safe, planar positions on the populated side of the circuit board to be lead trimmed.

2. The support apparatus of claim 1 which further comprises means for applying a vacuum to the chamber formed by the machine base plate, the perimeter frame and the circuit board to be lead trimmed.

3. The support apparatus of claim 2 wherein said means for securely maintaining is a retaining means for said positioning plate.

4. The support apparatus of claim 3 wherein said retaining means comprises at least two spaced-apart positioning pins vertically mounted on the upper surface of the base plate of the lead trimming machine which slidably meshes with corresponding holes in said positioning plate with minimal clearance.

5. The support apparatus of claim 3 wherein said retaining means comprises locking an exterior corner of said positioning plate with an interior corner of said perimeter frame using a single positioning pin vertically mounted on the upper surface of the bed of the lead trimming machine which slidably meshes with a corresponding hole in said position plate with minimal clearance.

6. The support apparatus of claim 2 wherein said means for securely maintaining comprises an adhesive coating applied between the base of said support posts and the lead trimming machine baseplate.

7. The support apparatus of claim 2 wherein said means for securely maintaining comprises;
   (a) a ferromagnetic base plate on the lead trimming machine; and
   (b) a permanent magnet installed in the base of each support post.

8. The support apparatus of claim 7 wherein said support post positioning plate is constructed of a ferromagnetic material.

9. The support apparatus of claim 8 wherein the magnet installed in the base of each support post is more strongly attracted to said base plate than to said positioning plate.

10. The support apparatus of claim 9 wherein said circuit board positioning means comprises a raised border on the upper surface of said circuit board support plate, the interior of which has a profile which is essentially identical to that of the edge of the circuit board, with clearance sufficient to allow the circuit board to be inserted without force into the region created by said border such that the board contacts the upper surface of said support plate.

11. The support apparatus of claim 9 wherein said circuit board positioning means comprises positioning pins installed in the upper surface of said circuit board support plate which slidably mate with alignment holes in the circuit board to be lead trimmed.

12. The support apparatus of claim 9 wherein said circuit board positioning means comprises a raised border around a portion of the perimeter of the circuit board to be trimmed.

* * * * *